(12) United States Patent
Seki et al.

(10) Patent No.: US 6,852,994 B2
(45) Date of Patent: Feb. 8, 2005

(54) ORGANIC EL DEVICE AND METHOD OF MANUFACTURING ORGANIC EL DEVICE

(75) Inventors: Shunichi Seki, Suwa (JP); Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/820,728

(22) Filed: Mar. 30, 2001

(65) Prior Publication Data

US 2002/0067123 A1 Jun. 6, 2002

(30) Foreign Application Priority Data

Mar. 31, 2000 (JP) ........................................ 2000-098160

(51) Int. Cl.[7] .............................................. H01L 35/24
(52) U.S. Cl. ........................... 257/40; 438/99; 438/780
(58) Field of Search ...................... 257/40, 918; 438/99, 438/22, 82

(56) References Cited

U.S. PATENT DOCUMENTS

| | | | | |
|---|---|---|---|---|
| 6,013,538 A | * | 1/2000 | Burrows et al. | 438/22 |
| 6,054,356 A | * | 4/2000 | Dawson et al. | 438/301 |
| 6,069,443 A | * | 5/2000 | Jones et al. | 313/504 |
| 6,384,529 B2 | * | 5/2002 | Tang et al. | 313/506 |

FOREIGN PATENT DOCUMENTS

| | | |
|---|---|---|
| JP | 7-235378 | 9/1995 |
| JP | 10-12377 | 1/1998 |
| JP | 10-153967 | 6/1998 |
| JP | 11-40358 | 2/1999 |
| JP | 11-54270 | 2/1999 |
| JP | A-11-74083 | 3/1999 |
| JP | A 11-074083 | 3/1999 |
| JP | 11-339957 | 12/1999 |
| WO | WO98/12689 | 3/1998 |

OTHER PUBLICATIONS

Tang, C.W. et al., "Organic electroluminescent diodes", *Appl. Phys. Lett.*, vol. 51, No. 12, Sep. 21, 1987, pp. 913–915.

Carter, J.C. et al., Operating stability of light–emitting polymer diodes based on poly (p–phenylene vinylene), *Appl. Phys. Lett.*, vol. 71, No. 1, Jul. 7, 1997, pp. 34–36.

Gustafsson, G. et al., "Flexible light–emitting diodes made from soluble conducting polymers", *Nature*, vol. 357, Jun. 11, 1992, pp. 477–479.

* cited by examiner

*Primary Examiner*—Long Pham
*Assistant Examiner*—Wai-Sing Louie
(74) *Attorney, Agent, or Firm*—Oliff & Berridge, PLC

(57) ABSTRACT

In a method of manufacturing an organic EL device by using an ink jet method, a discharge amount of an ink composition for a light emitting layer is made to be greater than a discharge amount of an ink composition for a hole injection/transportation layer, so that a film formation region of the light emitting layer becomes equal to, or greater than, a film formation region of the hole injection/transportation layer.

8 Claims, 2 Drawing Sheets

FIG. 6
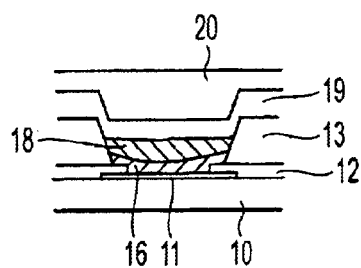
FIG. 7
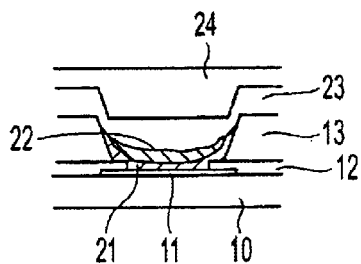
FIG. 8
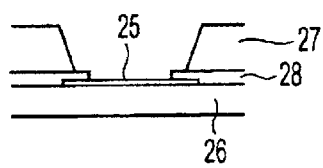
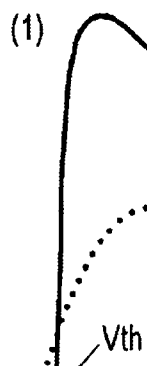
FIG. 9
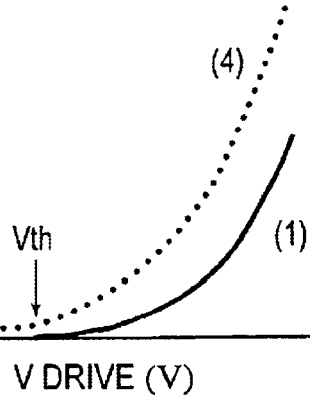
FIG. 10

ORGANIC EL DEVICE AND METHOD OF MANUFACTURING ORGANIC EL DEVICE

BACKGROUND OF THE INVENTION

1. Field of the Invention

This invention relates to an organic EL (electroluminescence) device that operates as an electric light emitting device for use in a display, a display light source, etc, and to a method of manufacturing thereof.

2. Description of Related Art

Recently, development has been accelerated of organic EL display devices using organic materials as spontaneous light emitting displays that will replace liquid crystal displays. Organic EL devices using the organic materials are principally described in the reference "Appl. Phys. Lett." 51(12), 21 Sep. 1987, p913, that discloses a vacuum deposition method of organic materials having a low molecular weight, and in the reference "Appl. Phys. Lett." 71(1), 7 Jul. 1997, p.34 et seq., that discloses an application method of organic materials having a high molecular weight.

In order to achieve color display in the case of the low molecular weight materials, a method that vacuum deposits different light emitting materials onto desired pixels through a mask has been employed. As to the high molecular weight materials, on the other hand, a coloring method using an ink jet method has drawn attention because it can execute patterning delicately and easily. Examples of the formation of organic EL devices by the ink jet method are disclosed in Japanese Patent Laid-Open Nos. 235378/1995, 12377/1998, 153967/1998, 40358/1999, 54270/1999 and 339957/1999.

A device structure includes a hole injection/transportation layer formed in many cases between an anode and a light emitting layer to enhance light emission efficiency and durability ("Appl. Phys. Lett." 51, 21 Sep. 1987, p913). The term "hole injection/transportation layer" used herein is a generic term of a layer that has a function of injecting and transporting holes from the anode side to a light emitting layer. According to the related art technology, a film of a buffer layer or a hole injection/transportation layer is formed by using conductive polymers, such as polythiophene derivatives or polyaniline derivatives, by an application method, such as spin coating ("Nature", 357, 477, 1992). The hole injection/transportation layer can be formed by vacuum depositing phenylamine derivatives as the low molecular weight material.

An ink jet system is extremely effective to easily form a film having a miniature pattern without wasting organic thin film materials.

However, when an organic EL device, having a laminate structure, is formed in accordance with the ink jet system and moreover, when the laminate structure includes a hole/injection layer plus a light emitting layer, for example, an underlying layer, as the conductive layer, is exposed when a cathode is formed, if an application region of the hole injection/transportation layer, as the underlying layer, is broader than the application region of the light emitting layer as an upper layer, with the result that a current leaks and the resulting device has low efficiency.

SUMMARY OF THE INVENTION

It is therefore an object of the present invention, when manufacturing an organic EL device having a laminate structure by an ink jet method, to provide a high efficiency organic EL device that is free from a current leak. It is also an object of the invention to provide a method of manufacturing such a high efficiency organic EL device.

The present invention provides an organic EL device having a structure in which a laminated film, of at least two layers, is formed by an ink jet system, and which includes a hole injection/transportation layer and a light emitting layer, a film formation region of the light emitting layer being equal to, or greater than, a film formation region of the hole injection/transportation layer.

The present invention also provides a method of manufacturing an organic EL device having a structure in which a laminated film, of at least two layers, is formed by an ink jet system, and which includes a hole injection/transportation layer and a light emitting layer, such that, when a discharge amount of an ink composition that forms the hole injection/transportation layer is A, and a discharge amount of an ink composition that forms the light emitting layer is B, a relationship of $A \leq B$ is satisfied.

The present invention also provides a method of manufacturing an organic EL device having a structure in which a laminated film, of at least two layers, is formed by an ink jet system, and which includes a hole injection/transportation layer and a light emitting layer, such that, when a sum of discharge amounts of an ink composition that forms the hole injection/transportation layer is A, and a sum of discharge amounts of an ink composition that forms the light emitting layer is B, a relationship of $A \leq B$ is satisfied.

BRIEF DESCRIPTION OF THE DRAWINGS

FIG. 6 is a sectional view showing still another step of the method of manufacturing the organic EL device according to one embodiment of the present invention;

FIG. 7 is a sectional view showing a structural example of an organic EL device;

FIG. 8 is a sectional view showing a substrate structure used in one embodiment according to the present invention;

FIG. 9 is a graph for comparing a voltage-light emission efficiency characteristic of an organic EL device according to an embodiment of the present invention;

FIG. 10 is a graph for comparing a voltage-current characteristic of an organic EL device according to an embodiment of the present invention.

DETAILED DESCRIPTION OF THE PREFERRED EMBODIMENTS

Figure 1:
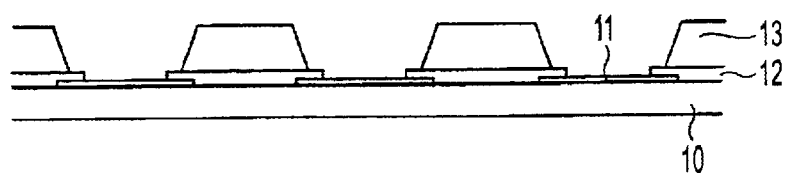
FIG. 1 is a sectional view showing a step of a method of manufacturing an organic EL device according to one embodiment of the present invention.
Figure 2:
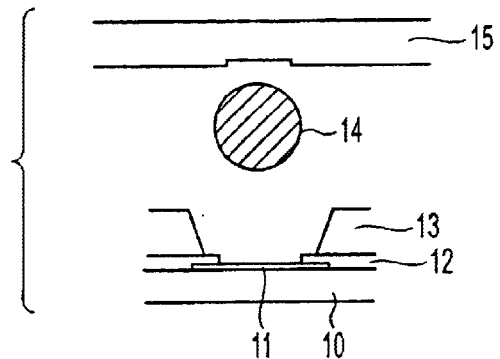
FIG. 2 is a sectional view showing another step of the method of manufacturing the organic EL device according to one embodiment of the present invention.
Figure 3:
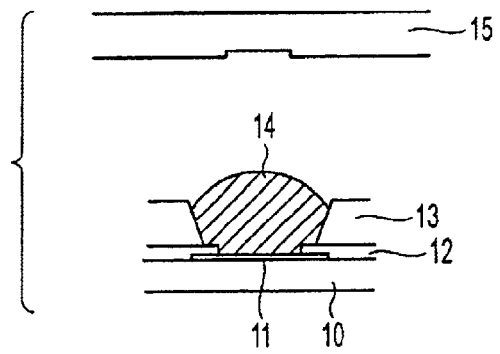
FIG. 3 is a sectional view showing another step of the method of manufacturing the organic EL device according to one embodiment of the present invention.
Figure 4:
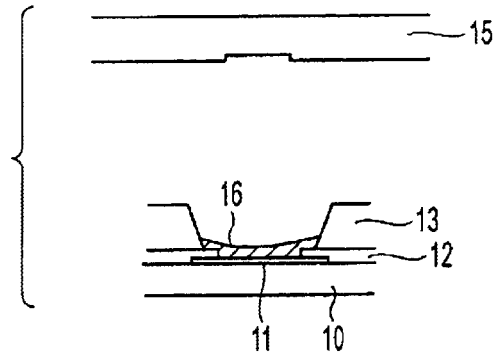
FIG. 4 is a sectional view showing still another step of the method of manufacturing the organic EL device according to one embodiment of the present invention.
Figure 5:
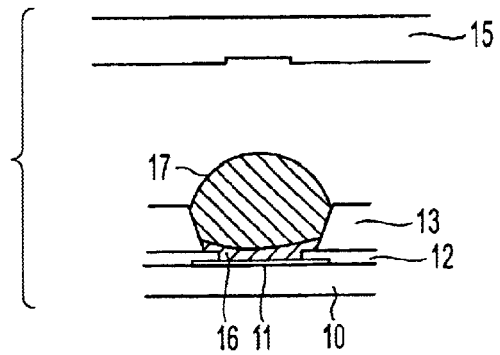
FIG. 5 is a sectional view showing still another step of the method of manufacturing the organic EL device according to one embodiment of the present invention.

In an organic EL device having a structure in which at least two laminated films are formed by an ink jet system, and which contains a hole injection/transportation layer and a light emitting layer, the present invention has a feature in that a film formation region of the light emitting layer is equal to, or greater than, a film formation region of the hole injection/transportation layer.

In the present specification, the term "film formation region of light emitting layer is equal to, or greater than, film formation region of hole injection/transportation layer" means, for example, that the film formation area or volume of the light emitting layer, as viewed plane-wise, is equal to, or greater than, the film formation area or volume of the hole injection/transportation layer, as viewed plane-wise.

The structure described above can prevent leakage between the hole injection/transportation layer and the cathode, and can provide an organic EL device having high efficiency.

In a method of manufacturing an organic EL device having a structure in which at least two layers of laminated films are formed by an ink jet system, and which includes a hole injection/transportation layer and a light emitting layer, the present invention has another feature in that, when a discharge amount of an ink composition that forms the hole injection/transportation layer is A, and a discharge amount of an ink composition that forms the light emitting layer is B, a relationship of $A \leq B$ is satisfied.

According to such a method of manufacturing an organic EL device, the relationship of $A \leq B$ is satisfied between the discharge amount A of the ink composition that forms the hole injection/transportation layer, and the discharge amount B of the ink composition when the light emitting layer is formed. When this condition is satisfied, the film formation region of the light emitting layer can be made equal to, or greater than, the film formation region of the hole injection/transportation layer. Accordingly, an organic EL device having high efficiency and being free from leakage can be provided when manufacturing an organic EL device having a laminate structure and produced by an ink jet system.

In a method of manufacturing an organic EL device having a structure in which at least two layers of laminated films are formed by an ink jet system, and which contains a hole injection/transportation layer and a light emitting layer, the present invention has another feature in that, when the sum of discharge amounts of an ink composition that forms the hole injection/transportation layer is A, and the sum of discharge amounts of an ink composition that forms the light emitting layer is B, the relationship of $A \leq B$ is satisfied.

According to such a method of manufacturing an organic EL device, the relationship of $A \leq B$ is satisfied when the sum of the discharge amounts of the ink composition that forms the hole injection/transportation layer is A, and the sum of the discharge amounts of the ink composition that forms the light emitting layer is B. When this condition is satisfied, it is possible to enhance patterning accuracy, to set the film formation region of the light emitting layer to be equal to, or greater than, the film formation region of the hole injection/transportation layer, and to provide an organic EL device having high efficiency and being free from the leakage. Since patterning accuracy is high, light emission with higher uniformity can be acquired in a panel, or the like, having a large number of pixels.

Hereinafter, an embodiment of the present invention will be explained in detail with reference to the drawings.

The method of manufacturing an organic EL device by the ink jet system includes the steps of preparing respective ink compositions by dissolving or dispersing materials of hole/injection transportation layer, made of organic materials that form the device, and light emitting materials in a solvent, discharging the ink composition from an ink jet head to form a pattern on a transparent substrate, and forming the hole injection/transportation layer and the light emitting material layer.

FIG. 1 is a sectional view of a substrate used for manufacturing an organic EL device by the ink jet system. ITO 11 is patterned as transparent pixel electrodes on a glass substrate 10 or a substrate equipped with TFT. Partitions (hereinafter called "banks") 13, that include $SiO_2$ 12 and an organic ink-repellent material, or an organic material rendered ink-repellent, are disposed in regions that partition the pixels. The shape of these banks, that is, the open shape of the pixels, may be any of a circle, an ellipse, a rectangle or a stripe. Since the ink composition has a surface tension, the corners of the rectangle are preferably rounded.

FIGS. 2 to 6 show a laminate layer of a hole injection/transportation layer+light emitting layer, and a method of manufacturing a device by the ink jet system. An ink composition 14, containing a hole injection/transportation material, is discharged from an ink jet head 15 and is applied into a pattern. After the ink composition is applied, the hole injection/transportation layer 16, is formed by removing the solvent, and/or conducting heat treatment, or causing a nitrogen gas to flow.

Subsequently, an ink composition 17, containing the light emitting materials, is applied onto the hole injection/transportation layer, and the light emitting layer 18 is formed by removing the solvent, and/or conducting heat treatment, or causing a nitrogen gas to flow.

Thereafter, a cathode 19 is formed by vacuum deposition or sputtering of a metal, such as Ca, Mg, Ag, Al, Li. To protect the device, a seal layer 20 is further formed from an epoxy resin, an acrylic resin or liquid glass, and the device is completed. An electrode, made of a reflective metal material, is used as an anode in place of the transparent electrode 11. A layer of a co-evaporation material, such as Ag or Mg, is disposed as the cathode. Thus, an organic EL device, of the type from which light travels through the cathode side, can be acquired.

FIGS. 6 and 7 show the sectional structure of the resulting device. In the device structure shown in FIG. 7, the hole injection/transportation layer 21 and the cathode 23 are kept in contact with each other, and current leakage develops and lowers device characteristics. To prevent the current leakage, it is necessary, for the structure of the organic EL device, that the film formation region of the light emitting layer 18 be equal to, or greater than, the film formation region of the hole injection/transportation layer 16, as shown in FIG. 6. When an electron injection/transportation layer is further to be laminated, the current leakage does not occur, even when the film formation region of the light emitting layer 18 is smaller than the film formation region of the hole injection/transportation layer 16, provided that the film formation region of the electron injection/transportation layer is equal to, or greater than, the film formation region of the hole injection/transportation layer. However, a drawback occurs in that the light emitting region becomes narrower.

To form a laminated film that is free from the current leakage, it is necessary to satisfy the relationship of $A \leq B$ with A representing the discharge amount of the ink composition for the hole injection/transportation layer, and B representing the discharge amount of the ink composition for the light emitting layer when the application of the ink composition is made once per pixel (by one droplet). When the amounts of A and B are reduced and the ink compositions are consecutively applied a large number of n and m times per pixel, respectively, the sums of the discharge amounts must satisfy the relationship of nA≦mB. These A and B amounts may well be adjusted suitably in accordance with the size of the pixels and the specification of the ink jet head (nozzle diameter, etc) used.

The present invention can be applied to organic EL devices of both an active matrix system and a passive matrix system.

The present invention will be explained in further detail with reference to the following examples, but is not particularly limited thereto.

EXAMPLE 1

FIG. 8 shows a substrate used in this example. Though the drawing shows only one pixel, these pixels were arranged in a 70.5 μm pitch. A bank was formed from a laminate layer of polyimide 27 and SiO$_2$ 28 by photolithography on a glass substrate 26 on which ITO 25 was patterned. A bank diameter (open diameter of SiO$_2$) was 28 μm and a height was 2 μm. Opening at the uppermost part of the polyimide bank was 32 μm. Before an ink composition of a hole injection/transportation material was applied, the polyimide bank 27 was subjected to ink-repelling treatment by atmospheric plasma treatment. The condition of the atmospheric plasma treatment was at an atmospheric pressure and power of 300 W, with a distance between an electrode and the substrate being 1 mm. In oxygen plasma treatment, an oxygen gas flow rate was 80 ccm, a helium gas flow rate was 10 SLM and a table conveying speed was 10 mm/sec. In subsequent plasma CF$_4$ processing, a CF$_4$ gas flow rate was 100 ccm, a helium gas flow rate was 10 SLM and a table conveying speed was 5 nm/sec. A composition shown in Table 1 was prepared as an ink composition for a hole injection/transportation layer.

TABLE 1

Ink composition for hole injection Layer

| composition | material name | content (wt %) |
|---|---|---|
| hole injection/transportation material | PEDT/PSS (",aytron P") (aqueous dispersion) | 7.25 |
| polar solvent | water | 52.75 |
| | methanol | 5 |
| | isopropyl alcohol | 5 |
| | 1,3-dimethyl-2-imidazolidinone | 30 |
| silane coupling agent | γ-glycidyloxypropyltrimethoxysilane | 0.08 |

After the surface treatment of the substrate, 15 pl of the ink composition for the hole injection/transportation layer, tabulated in Table 1, was discharged and applied into a pattern from a head (model MJ-930C of Epson Co.) of an ink jet printing apparatus. The solvent was removed at 1 Torr and a room temperature for 20 minutes, and heat treatment was then conducted in the open air at 200° C. (on a hot plate) for 10 minutes to form the hole injection/transportation layer.

A composition tabulated in Table 2 was prepared as an ink composition for the light emitting layer.

TABLE 2

Ink composition for light emitting layer (green)

| composition | material name | content (wt %) |
|---|---|---|
| light emitting material | PPV precursor solution (1.5 wt %) (water/methanol = 5/95 mixture solution) | 20 |
| polar solvent | 1,3-dimethyl-2-imidazolidinone | 70 |
| | butylcarbitol acetate | 10 |

First, 20 pl of the ink composition for the light emitting layer, tabulated in Table 2, was discharged and applied into a pattern from a head (model MJ-930C of Epson Co.) of an ink jet printing apparatus. After the solvent was removed at 1 Torr and a room temperature for 20 minutes, heat treatment was conducted at 150° C. for 4 hours in a nitrogen atmosphere to conjugate the composition and to form a green light emitting layer.

Ca and Al were sputtered to thickness of 20 nm and 200 nm, respectively, to form a cathode, and sealing was finally conducted by using an epoxy resin. The device fabricated by this example was referred to as "device (1)".

A color device and a color panel can be fabricated by dividedly forming different pixels by using ink compositions containing light emitting materials having different light emission colors, such as green, red and blue.

EXAMPLE 2

A device was fabricated in the same way as in Example 1, with the only exception that the discharge amounts of the ink composition for the hole injection/transportation layer and the ink composition for the light emitting layer were changed. The discharge amounts were 15 pl for the ink composition for the hole injection/transportation layer, and 15 pl for the ink composition for the light emitting layer, too. The device fabricated by this Example was referred to as "device (2)".

EXAMPLE 3

A device was fabricated in the same way as in Example 1, with the only exception that the discharge amounts of the ink composition for the hole injection/transportation layer and the ink composition for the light emitting layer and the number of times of their discharging were changed.

The ink composition for the hole injection/transportation layer in an amount of 5 pl was continuously discharged three times to the same pixel, while the ink composition for the light emitting layer (Table 1) in an amount of 10 pl was continuously discharged two times to the same pixel. When each composition was discharged several times by reducing its discharge amount, the diameter of the droplet became smaller. Because the droplets that had already been discharged and stored inside the pixel pulled subsequent droplets, accuracy of the impact point can be enhanced. The device fabricated in this embodiment was referred to as "device (3)".

EXAMPLE 4

A composition tabulated in Table 3 was prepared as the ink composition for the light emitting layer.

TABLE 3

Ink composition for light emitting layer (green)

| composition | material name | content (wt %) |
|---|---|---|
| light emitting material | PPV precursor solution (1.5 wt %) (water/methanol = 5/95 mixture solution) | 30 |
| polar solvent | 1,3-dimethyl-2-imidazolidinone | 60 |
| | butylcarbitol acetate | 10 |

The ink composition for the hole injection/transportation layer was the same as that used in Examples described above (Table 1). Next, 20 pl of the ink composition for the hole injection/transportation layer and 10 pl of the ink composition for the light emitting layer were discharged. The other conditions were the same as those of Example 1. The device fabricated in this example was referred to as "device (4)".

FIGS. 9 and 10 show current-voltage characteristics and efficiency-voltage characteristics of the devices (1) and (4) fabricated in Examples 1 and 4, respectively. In the device (4), a current leakage was observed in a low voltage region below a threshold voltage (Vth). For this reason, a curve of light emission efficiency rose more smoothly than in other devices not having the leak, and efficiency was lower, too. In the devices (1) to (3), high efficiency devices free from the current leak could be obtained.

When a substrate having 200×200 pixels was formed under the same conditions as those of Example 3, a green light emitting device that was uniform throughout the entire surface could be obtained.

EXAMPLE 5

Next, an example using materials that were soluble in an organic solvent was represented as the ink composition for the light emitting layer. Though this example used polydioctyl fluorine as a blue color light emitting layer, the present invention is not limited to polydialkyl fluorenes, and instead can also use polydialkylfluorene derivatives and polyparaphenylene vinylene derivatives, for example.

A composition as an ink composition for a light emitting layer tabulated in Table 4 and a composition as an ink composition for a hole injection/transportation layer tabulated in Table 5 were respectively prepared.

TABLE 4

Ink composition for hole injection layer

| composition | material name | content (wt %) |
|---|---|---|
| hole injection/transportation material | PEDT/PSS ("Pytron P") (aqueous dispersion) | 7.25 |
| | PSS (polystyrenesulfonic acid) | 0.94 |
| polar solvent | water | 51.81 |
| | methanol | 5 |
| | isopropyl alcohol | 5 |
| | 1,3-dimethyl-2-imidazolidinone | 30 |

TABLE 5

Ink composition for light emitting layer (blue)

| composition | material name | content |
|---|---|---|
| light emitting material | polydioctyl fluorine | 1 g |
| non-polar solvent | cyclohexylbenzene | 100 ml |

After the plasma treatment was conducted in the same way as in Example 1, 15 pl of the ink composition for the hole injection/transportation layer (Table 4) was discharged and applied into a pattern. The solvent was removed in vacuum (1 Torr) and at room temperature for 20 minutes. Heat treatment was then conducted in open air at 200° C. (on a hot plate) for 10 minutes, thereby forming the hole injection/transportation layer.

Next, 20 pl of the ink composition for the light emitting layer (Table 5) was discharged and applied into a pattern, and the solvent was removed in vacuum (1 Torr) and at room temperature for 20 minutes. Heat treatment was then conducted in a $N_2$ atmosphere at 50° C. for 20 minutes, thereby forming the light emitting layer. As a cathode, Ca was vacuum evaporated to a thickness of 20 nm and Al was sputtered to 200 nm. Finally, sealing was conducted by using an epoxy resin. This device, too, provided a high efficiency device free from the current leakage in the same way as the device of Example 1. In the device fabricated by using the same ink compositions and discharging 20 pl of the ink composition for the hole injection/transportation layer and 10 pl of the ink composition for the ink composition, the current leakage was observed even below a threshold voltage, and its light emission efficiency was lower than that of the device described above.

As described above, when fabricating an organic EL device having a laminate structure by an ink jet system, the present invention sets a discharge amount of an ink composition for a light emitting layer to be greater than a discharge amount of an ink composition for a hole injection/transportation layer. In this way, the present invention can make a film formation region of the light emitting layer to be greater than the film formation region of the hole injection/transportation layer, and can provide an excellent organic EL device that is free from a current leakage and having high light emission efficiency.

What is claimed is:

1. An organic EL device, comprising:

an anode;

a hole injection/transportation layer disposed over the anode;

a light emitting layer disposed over the hole injection/transportation layer;

a cathode disposed over the light emitting layer and separated from the hole injection/transportation layer; and a bank having a wall abutting on the edges of the hole injection/transportation layer and the light emitting layer to define film formation regions of the hole injection/transportation layer and the light emitting layer, the bank having a laminated structure with a plurality of layers to form at least a step between the layers, such that the film formation region of the light emitting layer covers the film formation region of the hole injection/transportation layer, the film formation region of the light emitting layer being greater than the film formation region of the hole injection/transportation layer.

2. The organic EL device according to claim 1 wherein the hole injection/transportation layer and the light emitting layer are disposed between a cathode and an anode, and wherein light emitted by the light emitting layer is output through the cathode.

3. The organic EL device according to claim 1 wherein the wall of the bank has rounded corners and defines the film formation regions with rounded corners.

4. An organic EL device, comprising:

an anode;

a bank having a wall defining a first and a second film formation regions, the bank having a laminated structure with a plurality of layers to form at least a step between the layers, such that the second film formation region covers the first film formation region;

a hole injection/transportation layer spread within the first film formation region and disposed over the anode layer;

a light emitting layer spread above the hole injection/transportation layer and within the second film formation region;

a cathode disposed over the light emitting layer and separated from the hole injection/transportation layer, the second film formation region covering the first film formation region, the second film formation region being greater than the first film formation region.

5. The organic EL device according to claim 4, wherein the shapes of the first and second film formation regions are quadrilateral.

6. The organic EL device according to claim 4, wherein the shapes of the first and second film formation regions have rounded corners.

7. The organic EL device according to claim 1, wherein the wall of the bank has a slope to define the film formation region of the light emitting layer being larger, in area, than the film formation region of the hole injection/transportation layer.

8. The organic EL device according to claim 4, wherein the wall of the bank has a slope to define the film formation region of the light emitting layer being larger, in area, than the film formation region of the nole injection/transportation layer.

* * * * *